United States Patent
Chen et al.

(10) Patent No.: US 8,791,533 B2
(45) Date of Patent: Jul. 29, 2014

(54) SEMICONDUCTOR PACKAGE HAVING AN INTERPOSER CONFIGURED FOR MAGNETIC SIGNALING

(75) Inventors: Xiangdong Chen, Irvine, CA (US); Sam Ziqun Zhao, Irvine, CA (US); Kevin Kunzhong Hu, Irvine, CA (US); Sampath K. V. Karikalan, Irvine, CA (US); Rezaur Rahman Khan, Rancho Santa Margarita, CA (US); Pieter Vorenkamp, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 335 days.

(21) Appl. No.: 13/361,598

(22) Filed: Jan. 30, 2012

(65) Prior Publication Data

US 2013/0193587 A1      Aug. 1, 2013

(51) Int. Cl.
*H01L 29/82* (2006.01)

(52) U.S. Cl.
USPC .................... 257/421; 257/422; 257/777

(58) Field of Classification Search
USPC ................. 257/421–427, 777, E29.323
See application file for complete search history.

(56) References Cited

U.S. PATENT DOCUMENTS

| | | | |
|---|---|---|---|
| 8,455,965 B2 * | 6/2013 | Li et al. | 257/421 |
| 8,492,881 B2 * | 7/2013 | Kuroiwa et al. | 257/421 |
| 8,629,520 B2 * | 1/2014 | Doogue et al. | 257/422 |

* cited by examiner

*Primary Examiner* — Cuong Q Nguyen
(74) *Attorney, Agent, or Firm* — McDermott Will & Emery LLP

(57) ABSTRACT

There are disclosed herein various implementations of semiconductor packages having an interposer configured for magnetic signaling. One exemplary implementation includes a die transmit pad in an active die for transmitting a magnetic signal corresponding to a die electrical signal produced by the active die, and an interposer magnetic tunnel junction (MTJ) pad in the interposer for receiving the magnetic signal. A sensing circuit is coupled to the interposer MTJ pad for producing a receive electrical signal corresponding to the magnetic signal. In one implementation, the sensing circuit is configured to sense a resistance of the interposer MTJ pad and to produce the receive electrical signal according to the sensed resistance.

20 Claims, 5 Drawing Sheets

SEMICONDUCTOR PACKAGE HAVING AN INTERPOSER CONFIGURED FOR MAGNETIC SIGNALING

BACKGROUND

Packaging solutions continue to evolve to meet the increasingly stringent design constraints imposed by electronic devices and systems with ever higher integrated circuit (IC) densities. One approach to enabling higher density "three-dimensional (3D)" packaging of multiple IC chips together, for example, typically utilizes one or more interposers to mediate transfer of chip-to-chip and/or chip to package electrical signals. For instance, two or more IC chips having a reduced pitch size may be connected by micro-bumps to an interposer, while the interposer may be electrically connected to the semiconductor package by conventional solder balls. As the IC chips are fabricated at ever smaller process technology nodes, however, even the increased densities enabled by micro-bump scale physical connections will be unable to accommodate the further reductions in pitch size.

An alternative to the use of small electrical contact bodies, such as micro-bumps, is to produce electrical connections without any physical contact between the IC chip and the interposer. For example, various capacitive and inductive schemes for providing "contactless" electrical connections have been proposed. However, in practice, such approaches have been plagued by excessive noise and interference when implemented at high densities.

SUMMARY

The present disclosure is directed to a semiconductor package having an interposer configured for magnetic signaling, substantially as shown in and/or described in connection with at least one of the figures, and as set forth more completely in the claims.

DETAILED DESCRIPTION

Figure 1:
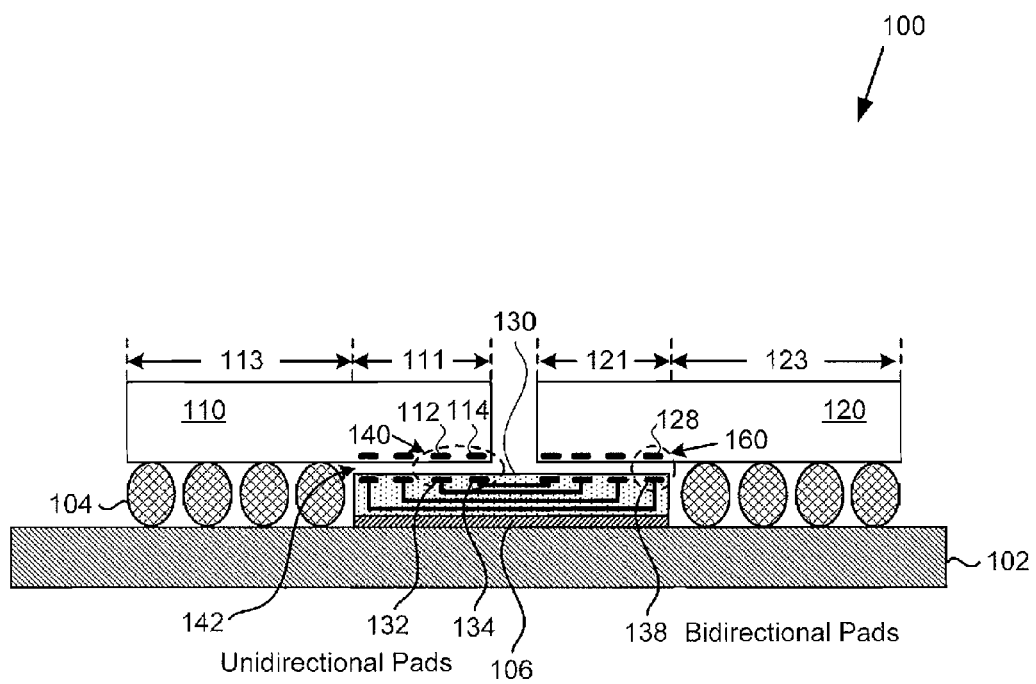
FIG. 1 shows a cross-sectional view of one implementation of a semiconductor package including an interposer configured for magnetic signaling.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise; like or corresponding elements among the figures may be indicated by like or corresponding reference numerals. Moreover, the drawings and illustrations in the present application are generally not to scale, and are not intended to correspond to actual relative dimensions.

FIG. 1 shows a cross-sectional view of one implementation of a semiconductor package including an interposer configured for magnetic signaling. As shown in FIG. 1, semiconductor package 100 includes first active die 110 having first portion 111 and second portion 113, second active die 120 having first portion 121 and second portion 123, interposer 130, and package substrate 102. First active die 110 includes die transmit pad 112 and die magnetic tunnel junction (MTJ) pad 114 situated in first portion 111, adjacent respective interposer MTJ pad 132 and interposer transmit pad 134, in region 140. In addition, second active die 120 includes die MTJ pad 128 situated in first portion 121, adjacent interposer MTJ pad 138, in region 160. As indicated in FIG. 1, die transmit pad 112, die MTJ pad 114, interposer MTJ pad 132, interposer transmit pad 134 are configured as unidirectional signaling pads, while die MTJ pad 128 and interposer MTJ pad 138 are configured for bidirectional signaling.

Also shown in FIG. 1 are solder balls 104, die attach film 106 securing interposer 130 to package substrate 102, and gap 142 separating first active die 110 from interposer 130 and separating second active die 120 from interposer 130. It is noted that although only one exemplary solder ball is specifically designated by reference number 104 in FIG. 1, any or all of the eight solder balls shown in FIG. 1 may be characterized as solder ball(s) 104.

First active die 110 and second active die 120 may be packaged or unpackaged dies, for example. Although first active die 110 and second active die 120 are shown in flip chip configuration, in FIG. 1, that representation is merely exemplary, and in other implementations, one or both of first active die 110 and second active die 120 may exhibit a different orientation, such as a face-up configuration wherein solder balls 104 may be replaced by wire bond. Moreover, it is to be understood that although the implementation shown in FIG. 1 depicts two active dies coupled to interposer 130, e.g., first active die 110 and second active die 120, in other implementations, a single active die, or more than two active dies may be coupled to interposer 130 and included within semiconductor package 100.

Interposer 130 may be formed of a rigid dielectric material, such as fiber reinforced bismaleimide triazine (BT), FR-4, glass, or ceramic, for example. Alternatively, interposer 130 may be formed of a flexible dielectric, such as a polyimide film or other suitable tape material. In some implementations interposer 130 may be formed of an epoxy-phenolic or cyanate ester-epoxy build-up material. As a specific example, in one implementation, interposer 130 may be formed of an Ajinomoto™ Build-up Film (ABF).

As shown by FIG. 1, in semiconductor package 100, first active die 110 has first portion 111 situated over interposer 130, and second portion 113 electrically connected to package substrate 102 by solder balls 104. In addition, second active die 120 has first portion 121 situated over interposer 130, and second portion 123 electrically connected to package substrate 102 by solder balls 104. As a result, first active die 110 and second active die 120 are configured to communicate electrical signals to package substrate 102 utilizing solder balls 104, and to communicate chip-to-chip signals using the unidirectional signaling pads of region 140 and the bidirectional signaling pads of region 160. In other words, first active die 110 and second active die 120 may utilize solder balls 104 for ground, power, and input/output (I/O) connections, for example, while communicating chip-to-chip signals through interposer 130 utilizing unidirectional die transmit pad 112, die MTJ pad 114, interposer MTJ pad 132, and interposer transmit pad 134, and bidirectional die MTJ pad 128 and interposer MTJ pad 138.

Figure 2:
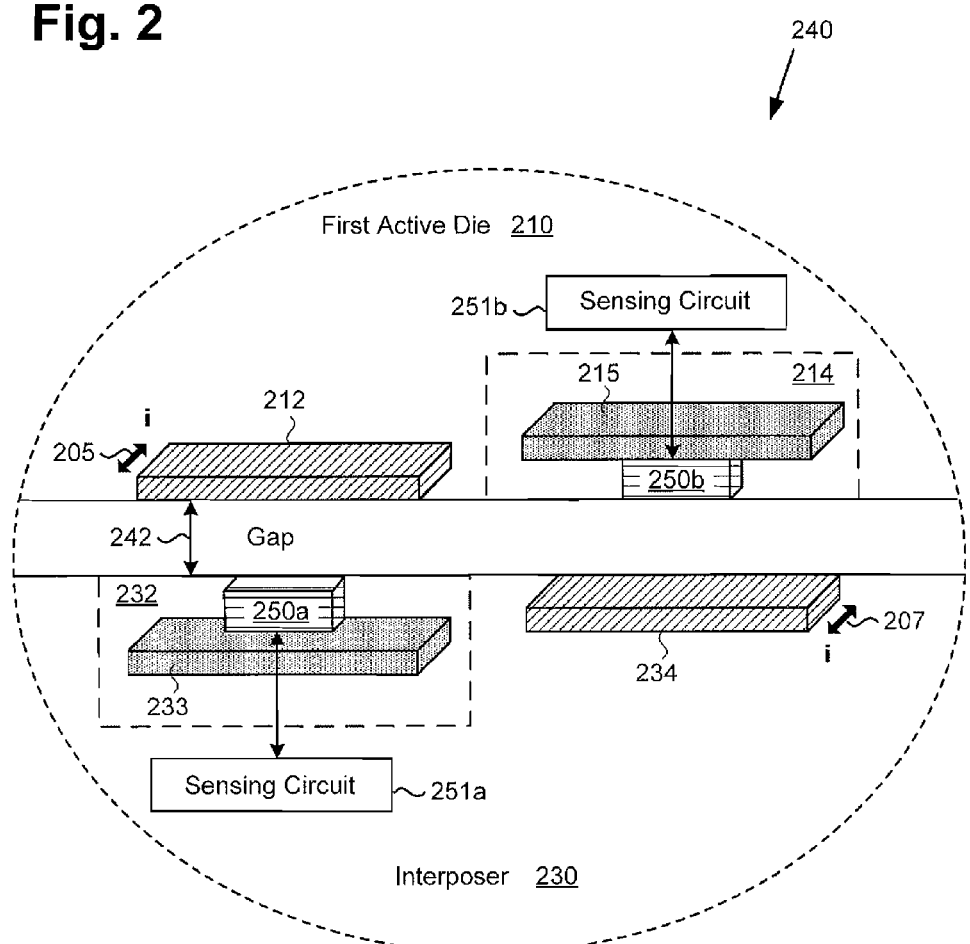
FIG. 2 shows a more detailed view of a region of the semiconductor package of FIG. 1.

Referring now to FIG. 2, FIG. 2 shows a more detailed view of region 140 of semiconductor package 100, in FIG. 1. As shown in FIG. 2, region 240 (corresponding generally to a more detailed view of region 140 of FIG. 1) includes a portion of first active die 210 including die transmit pad 212 and die MTJ pad 214, as well as a portion of interposer 230 including interposer MTJ pad 232 and interposer transmit pad 234. Also shown in FIG. 2 are signaling currents 205 and 207, MTJs 250a and 250b, sensing circuits 251a and 251b, communication pads 215 and 233, and gap 242 separating first active die 210 from interposer 230. Region 240 including die transmit pad 212, die MTJ pad 214, interposer MTJ pad 232, and interposer transmit pad 234 corresponds to region 140 including die transmit pad 112, die MTJ pad 114, interposer MTJ pad 132, and interposer transmit pad 134, in FIG. 1. In addition, gap 242, in FIG. 2, corresponds to gap 142, in FIG. 1.

According to the implementation shown in FIG. 2, die transmit pad 212 and interposer MTJ pad 232 are configured for unidirectional signaling from first active die 210 to interposer 230. For example, die transmit pad 212 in first active die 210 can be used for transmitting a magnetic signal corresponding to a die electrical signal produced by first active die 210 and represented by signaling current 205 at die transmit pad 212. Interposer MTJ pad 232 in interposer 230 is provided for receiving the magnetic signal transmitted by die transmit pad 212, through use of MTJ 250a. In addition, sensing circuit 251a in interposer 230 is coupled to interposer MTJ pad 232 and can be utilized for producing a receive electrical signal in interposer 230 corresponding to the magnetic signal transmitted by die transmit pad 212 of first active die 210.

Die transmit pad 212 and communication pad 233 of interposer MTJ pad 234 may be patterned from respective metal routing layers on first active die 210 and interposer 230, and may be formed of copper or aluminum, for example. As shown in FIG. 2, die transmit pad 212 and interposer MTJ pad 232 are adjacent one another. As further shown in FIG. 2, die transmit pad 212 and interposer MTJ pad 232 are spaced apart by gap 242. In other words, die transmit pad 212 and interposer MTJ pad 232 are neither in direct physical contact, nor electrically coupled by a conductive body, such as a microbump or conductive post or pillar, for example. Thus, the unidirectional signaling that occurs from die transmit pad 212 to interposer MTJ pad 232 is an electromagnetic field mediated and effectively "contactless" magnetic signaling process.

Figure 3:
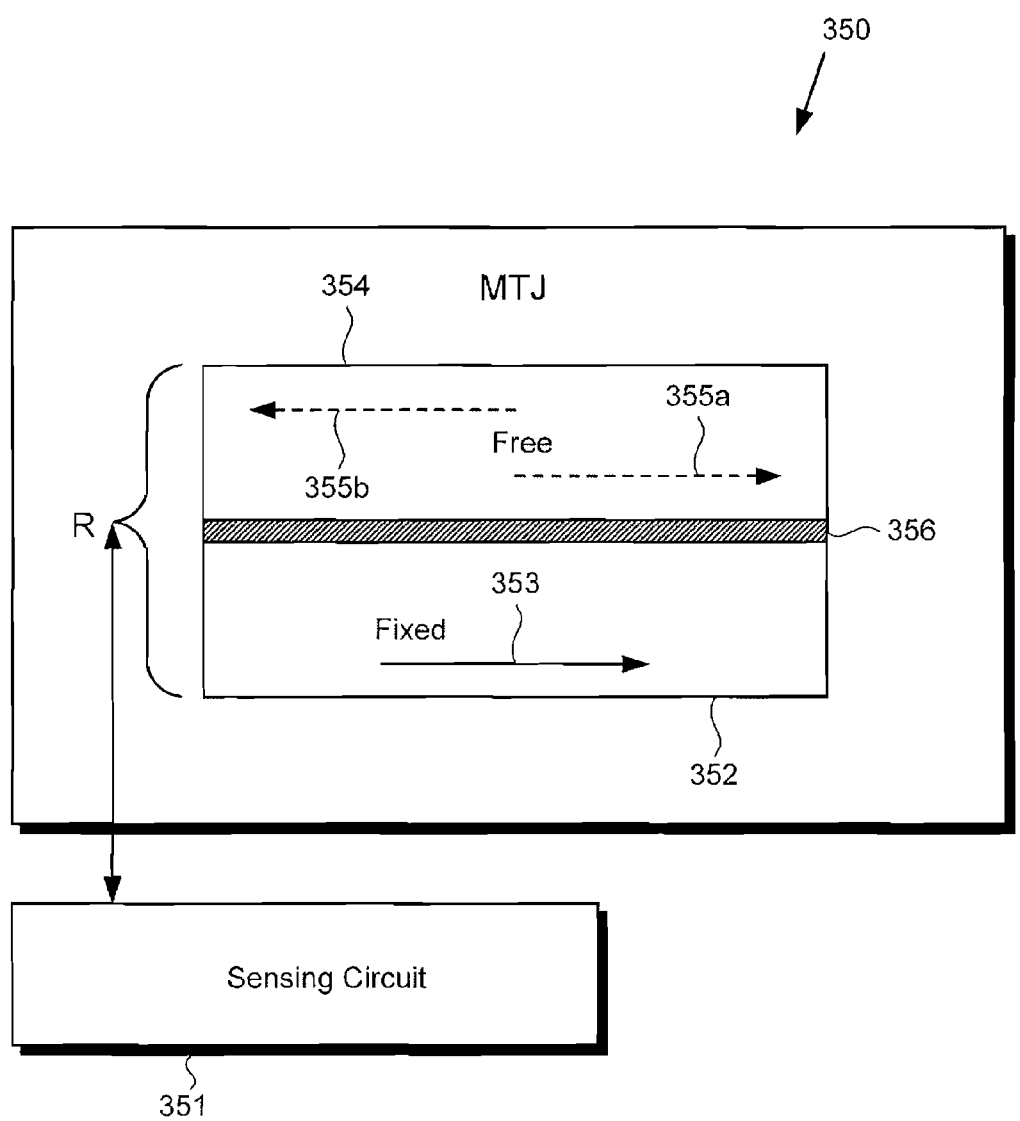
FIG. 3 shows one implementation of a magnetic tunnel junction (MTJ) suitable for use in the semiconductor package of FIG. 1.

The mechanism through which magnetic signaling from die transmit pad 212 to interposer MTJ pad 232 is achieved will be described by additional reference to FIG. 3. FIG. 3 shows MTJ 350 in combination with sensing circuit 351. As shown in FIG. 3, MTJ 350 includes fixed magnetic layer 352 and free magnetic layer 354 separated by tunnel dielectric 356. MTJ 350 corresponds to either or both of MTJ 250a and MTJ 250b, in FIG. 2, while sensing circuit 351, in FIG. 3, corresponds to either or both of respective sensing circuits 251a and 251b, in FIG. 2.

It is noted that only selected features of MTJ 350 are shown in FIG. 3, in the interests of conceptual clarity. For example, MTJ 350 is not shown to include the pinning layer that is typically included in an MTJ and used for fixing or pinning the direction 353 of the magnetic moment in fixed magnetic layer 352, as known in the art. Unlike fixed magnetic layer 352, which, as noted previously, has direction 353 of its magnetic moment fixed, free magnetic layer 354 may have its magnetic moment oriented in direction 355a parallel to direction 353, or alternatively oriented in direction 355b antiparallel to direction 353.

The resistance (R) measured across free magnetic layer 354, tunnel dielectric 356, and fixed magnetic layer 353 will depend upon whether fixed magnetic layer 354 has its magnetic moment oriented in direction 355a or 355b. For example, and as known in the art, when the magnetic moment of free magnetic layer 354 is in direction 355b antiparallel to direction 353 of the magnetic moment of fixed magnetic layer 352, the antiparallel resistance ($R_{AP}$) across free magnetic layer 354, tunnel dielectric 356, and fixed magnetic layer 353 is different than (e.g., greater than) the corresponding parallel resistance ($R_P$) measured when the magnetic moment of free magnetic layer 354 assumes direction 355a. Moreover, and depending on the composition of fixed magnetic layer 352, free magnetic layer 354, and tunnel dielectric 356, that difference between $R_{AP}$ and $R_P$ can be significant, and may be used by sensing circuit 351 to sense a high or low state of MTJ 350, such as a "0" or "1" logic state of MTJ 350, for example, according to resistance R. Fixed magnetic layer 352 and free magnetic layer 354 may be formed of ferromagnetic materials, for example, such as iron-cobalt or nickel-iron-cobalt, while tunnel dielectric 356 may include a tunneling barrier formed of an oxide such as aluminum oxide, manganese oxide, or tantalum oxide.

Thus, an external magnetic field capable of determining the orientation of the magnetic moment of free magnetic layer 354 in one of directions 355a or 355b can serve as a magnetic signal for MTJ 350, while the responsive orientation or reorientation of the magnetic moment of free magnetic layer 354 can correspond to reception of that magnetic signal by MTJ 350. As a result, MTJ 350, which may be a nanometer scale structure, for example, can serve as a receiving unit for a magnetic signal and is capable of implementation as a part of a high density "contactless" interconnect for magnetic signaling between an active die and an interposer, such as the interconnect corresponding to die transmit pad 212 and interposer MTJ pad 232, in FIG. 2, for example.

Referring back to FIG. 2, interposer transmit pad 234 and die MTJ pad 214 are configured for unidirectional signaling from interposer 230 to first active die 210. For example, interposer transmit pad 234 in interposer 230 can be used for transmitting an interposer magnetic signal corresponding to signaling current 207 at interposer transmit pad 234. Die MTJ pad 214 in first active die 210 is provided for receiving the interposer magnetic signal transmitted by interposer transmit pad 234, through use of MTJ 250b, as explained above by reference to FIG. 3. In addition, sensing circuit 251b in first active die 210 is coupled to die MTJ pad 214 and can be utilized for producing a receive electrical signal in first active die 210 corresponding to the interposer magnetic signal transmitted by interposer transmit pad 234.

Like die transmit pad 212 and communication pad 233 of interposer MTJ pad 234 described above, interposer transmit pad 234 and communication pad 215 of die MTJ pad 214 may be patterned from respective metal routing layers on interposer 230 and first active die 210, and may be formed of copper or aluminum, for example. As shown in FIG. 2, interposer transmit pad 234 and interposer MTJ pad 232 are adjacent one another. As further shown in FIG. 2, interposer transmit pad 234 and die MTJ pad 214 are spaced apart by gap 242. In other words, like die transmit pad 212 and interposer MTJ pad 232, interposer transmit pad 234 and die MTJ pad 214 are neither in direct physical contact, nor electrically coupled by a conductive body, such as a micro-bump or conductive post or pillar, for example. Thus, the unidirectional signaling that occurs from interposer transmit pad 234 to die MTJ pad 214 is an electromagnetic field mediated and effectively "contactless" magnetic signaling process as described above by reference to FIG. 3.

Figure 4:
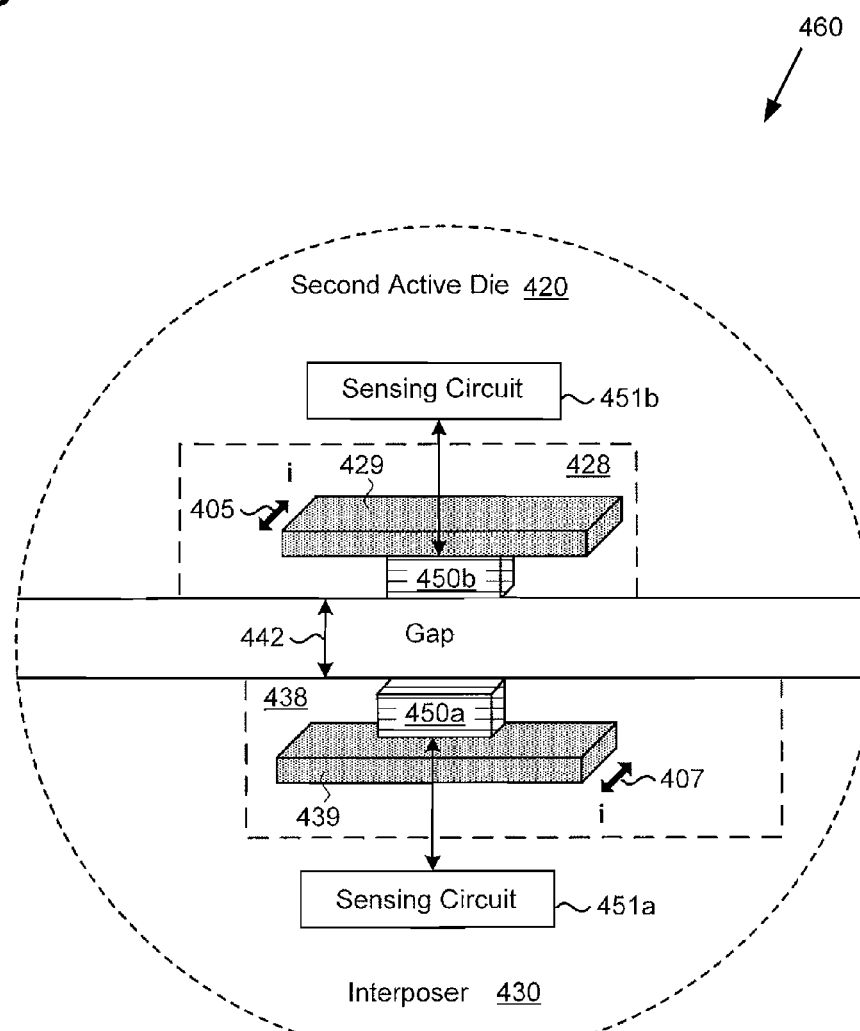
FIG. 4 shows a more detailed view of another region of the semiconductor package of FIG. 1.

Moving now to FIG. 4, FIG. 4 shows a more detailed view of region 160 of semiconductor package 100, in FIG. 1. As shown in FIG. 4, region 460 (corresponding generally to a more detailed view of region 160 of FIG. 1) includes a portion of second active die 420 including die MTJ pad 428, as well as a portion of interposer 430 including interposer MTJ pad 438. Also shown in FIG. 4 are signaling currents 405 and 407, MTJs 450a and 450b, sensing circuits 451a and 451b, communication pads 429 and 439, and gap 442 separating second active die 420 from interposer 430. Region 460 including die MTJ pad 428 and interposer MTJ pad 438 corresponds to region 160 including die MTJ pad 128 and interposer MTJ pad 138, in FIG. 1. In addition, gap 442, in FIG. 4, corresponds to gap 142, in FIG. 1. Moreover, MTJs 450a and 450b, and sensing circuits 451a and 451b correspond respectively to MTJ 350 and sensing circuit 351, in FIG. 3, and may be understood to share the characteristics attributed to those corresponding features above.

According to the implementation shown in FIG. 4, die MTJ pad 428 and interposer MTJ pad 438 are configured for bidirectional signaling between second active die 420 and interposer 430. For example, second active die 420 can produce a die electrical signal for transmission by die transmit pad 428 situated in second active die 420 to interposer MTJ pad 438 situated in interposer 430, and interposer 430 can pass an interposer electrical signal for transmission by interposer MTJ pad 438 to die MTJ pad 428. Die MTJ pad 428 may be configured to transmit the die electrical signal produced by second active die 420 as a magnetic signal corresponding to the die electrical signal, for example, as well as to receive a magnetic signal transmitted by interposer MTJ pad 438 corresponding to the interposer electrical signal. Analogously, interposer MTJ pad 438 may be configured to transmit the interposer electrical signal passed by interposer 430 as a magnetic signal corresponding to the interposer electrical signal, as well as to receive the magnetic signal transmitted by die MTJ pad 438. In addition, sensing circuit 451a in interposer 430 and coupled to interposer MTJ pad 438, and sensing circuit 451b in second active die 420 and coupled to die MTJ pad 428 can be utilized for producing respective receive electrical signals in interposer 430 and second active die 420 corresponding respectively to the magnetic signals transmitted by die MTJ pad 428 of second active die 420 and interposer MTJ pad 438 of interposer 430.

Communication pads 429 and 439 of respective die MTJ pad 428 and interposer MTJ pad 439 may be patterned from respective metal routing layers on second active die 420 and interposer 430, and may be formed of copper or aluminum, for example. As shown in FIG. 4, die MTJ pad 428 and interposer MTJ pad 438 are adjacent one another. As further shown in FIG. 4, die MTJ pad 428 and interposer MTJ pad 438 are spaced apart by gap 442. In other words, die MTJ pad 428 and interposer MTJ pad 438 are neither in direct physical contact, nor electrically coupled by a conductive body, such as a micro-bump or conductive post or pillar, for example. Thus, the bidirectional signaling that occurs between die MTJ pad 428 and interposer MTJ pad 438 is an electromagnetic field mediated and effectively "contactless" magnetic signaling process.

Some of the features and advantages of the implementations shown in FIGS. 1 through 4 will now be further described by reference to FIG. 5, which shows flowchart 500 presenting an exemplary method for magnetic signaling between an active die and an interposer within a semiconductor package. Flowchart 500 begins with generating a die electrical signal by an active die (510). Referring, for example, to region 240, in FIG. 2, flowchart 500 may begin by generating signaling current 205, by first active die 210, in die transmit pad 212. Alternatively, and referring now to FIG. 4, when bidirectional signaling is desired, flowchart 500 may begin with generation of signaling current 405 in communication pad 429, which, according to the implementation shown in FIG. 4, may serve as a transmit pad of die MTJ pad 428 of second active die 420.

Flowchart 500 continues by transmitting a magnetic signal corresponding to the die electrical signal through a die transmit pad of the active die (520). As noted above, the present approach to signaling utilizes an electromagnetic field to mediate communication of a transmit signal. For example, referring to FIG. 2, generation of signaling current 205 in die transmit pad 212 may be understood to produce a circulating magnetic field in the vicinity of die transmit pad 212. Analogously, and referring again to FIG. 4, generation of signaling current 405 in communication pad 429 of die MTJ pad 428 may be understood to produce a circulating magnetic field in the vicinity of die MTJ pad 428. Such a circulating magnetic field may serve as a magnetic signal transmitted by the active die producing the respective signaling current.

Flowchart 500 continues by receiving the magnetic signal by an MTJ pad of an interposer adjacent the die transmit pad (530). Referring again to FIG. 2, reception of the magnetic signal produced by signaling current 205 in die transmit pad 212 may be performed by MTJ 250a of interposer MTJ pad 232, which is shown to be situated adjacent die transmit pad 212. Referring to FIG. 3, it may be understood that a circulating magnetic field produced by a signaling current above MTJ 350 and flowing perpendicular to the plane defined by FIG. 3 while being directed out of the figure will cause the magnetic moment of free magnetic layer 354 to align with direction 355a parallel to direction 353 of fixed magnetic layer 352. Conversely, a circulating magnetic field produced by a signaling current above MTJ 350 and flowing perpendicular to the plane defined by FIG. 3 while being directed into the figure will cause the magnetic moment of free magnetic layer 354 to align with direction 355b antiparallel to direction 353 of fixed magnetic layer 352. Thus, orientation or reorientation of the direction of the magnetic moment of free magnetic layer 354 may correspond to reception by an MTJ pad including an MTJ corresponding to MTJ 350, such as interposer MTJ pads 232 or 438, of a magnetic signal produced by an adjacent die transmit pad, such as die transmit pad 212 or communication pad 429 of die MTJ pad 438, respectively.

Flowchart 500 continues by sensing a resistance of the MTJ pad using a sensing circuit in the interposer (540). As noted above, according to one implementation, the present approach to signaling utilizes the resistance measured across an MTJ resulting from orientation of the magnetic moment in the free magnetic layer of the MTJ to identify a logic state corresponding to a magnetic signal received using the MTJ. As shown in FIG. 2, for example, sensing circuit 251a in interposer 230 is coupled to interposer MTJ pad 232, and may be used to sense the resistance across MTJ 250a. That sensed or measured resistance can then be used by sensing circuit 251a to produce a receive signal corresponding to the die electrical signal produced by first active die 210 according to the resistance of MTJ 250a (550), as described above by reference to corresponding MTJ 350, in FIG. 3. By analogy, the resistance across MTJ 450a of interposer MTJ pad 438, in FIG. 4, can be sensed by sensing circuit 451a and used by sensing circuit 451a to produce a receive signal corresponding to the die electrical signal produced by second active die 420.

Figure 5:
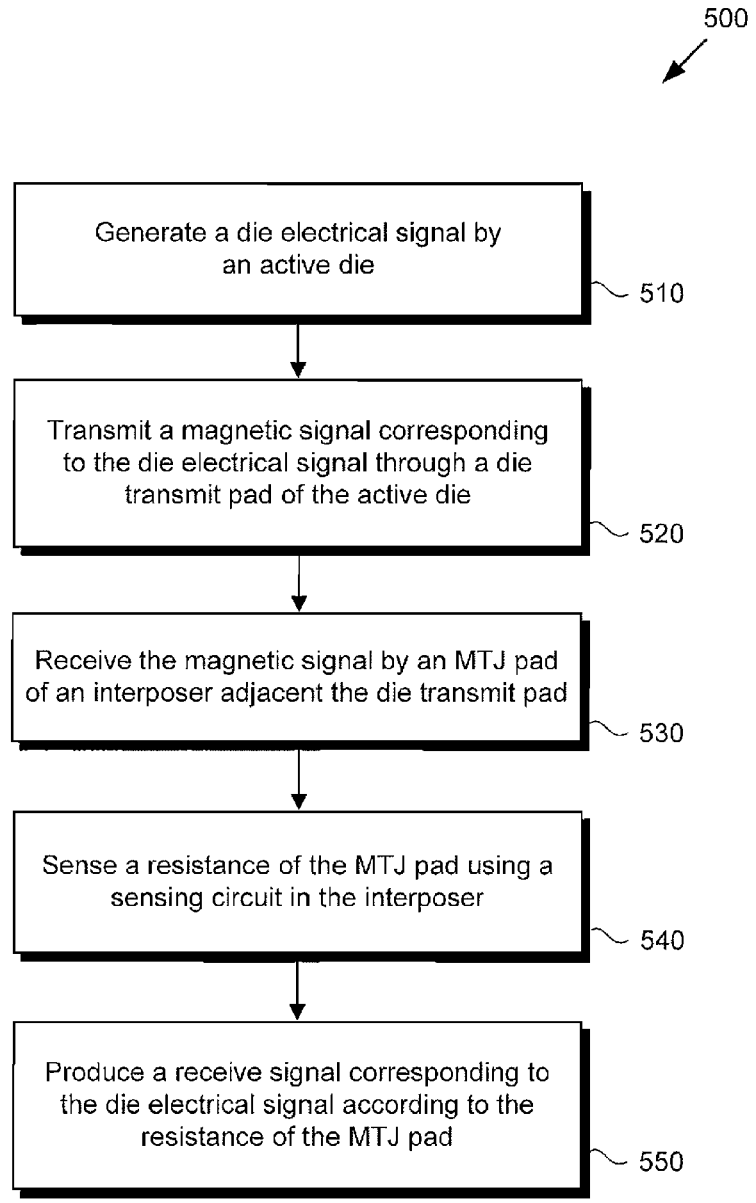
FIG. 5 shows a flowchart presenting an exemplary method for magnetic signaling between an active die and an interposer within a semiconductor package.

Although not shown in FIG. 5, it is to be understood that the method of flowchart 500 may further include transmitting an interposer magnetic signal corresponding to an interposer electrical signal through an interposer transmit pad (e.g., interposer transmit pad 234, in FIG. 2, or communication pad 439 of interposer MTJ pad 438, in FIG. 4), receiving the interposer magnetic signal by a die MTJ pad (e.g., die MTJ pad 214, in FIG. 2, or die MTJ pad 428, in FIG. 4), and producing a receive electrical signal corresponding to the interposer magnetic signal by a sensing circuit coupled to the die MTJ pad (e.g., sensing circuit 251b in first active die 210 of FIG. 2, or sensing circuit 451b in second active die 420 of FIG. 4).

As explained above, the implementation shown in FIG. 2 is configured to provide unidirectional signaling from first active die 210 to interposer 230 through die transmit pad 212 and interposer MTJ pad 232, and unidirectional signaling from interposer 230 to first active die 210 through interposer transmit pad 234 and die MTJ pad 214. As further explained above, the implementation shown in FIG. 4 is configured to provide bidirectional signaling between second active die 420 and interposer 430 through die MTJ pad 428 and interposer MTJ pad 438. Consequently, the example method described by flowchart 500 can be performed using either or both of the implementations shown in FIGS. 2 and 4 to provide unidirectional and/or bidirectional signaling.

Thus, in contrast to conventional semiconductor packaging solutions in which an interposer is typically coupled to active dies using contact bodies, such as micro-humps or conductive posts or pillars, the implementations disclosed by the present application enable use of MTJ pads including nanometer scale MTJ structures, for example, to provide high density "contactless" interconnects. Moreover, by implementing a magnetic signaling scheme for communications from a transmit pad to an MTJ pad, or between MTJ pads, the present application discloses a packaging solution capable of providing high density "contactless" interconnects while avoiding the excessive noise and interference plaguing the conventional art.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package including an active die and an interposer, said semiconductor package comprising:
   a die transmit pad in said active die for transmitting a magnetic signal corresponding to a die electrical signal produced by said active die;
   an interposer magnetic tunnel junction (MTJ) pad in said interposer for receiving said magnetic signal;
   a sensing circuit coupled to said interposer MTJ pad for producing a receive electrical signal corresponding to said magnetic signal.

2. The semiconductor package of claim 1, wherein said die transmit pad and said interposer MTJ pad are spaced apart by a gap.

3. The semiconductor package of claim 1, wherein said die transmit pad and said interposer MTJ pad are configured for unidirectional signaling from said active die to said interposer.

4. The semiconductor package of claim 1, further comprising:
   an interposer transmit pad in said interposer for transmitting an interposer magnetic signal corresponding to an interposer electrical signal;
   a die MTJ pad in said active die for receiving said interposer magnetic signal.

5. The semiconductor package of claim 4, further comprising a sensing circuit coupled to said die MTJ pad for producing said interposer electrical signal corresponding to said interposer magnetic signal.

6. The semiconductor package of claim 1, wherein said interposer transmit pad and said die MTJ pad are configured for unidirectional signaling from said interposer to said active die.

7. A semiconductor package including an active die and an interposer, said semiconductor package comprising:
   a die magnetic tunnel junction (MTJ) pad situated in said active die;
   an interposer MTJ pad situated in said interposer;
   said active die configured to produce a die electrical signal for transmission by said die MTJ pad to said interposer MTJ pad;
   said interposer configured to pass an interposer electrical signal for transmission by said interposer MTJ pad to said die MTJ pad.

8. The semiconductor package of claim 7, wherein said die MTJ pad and said interposer MTJ pad are spaced apart by a gap.

9. The semiconductor package of claim 7, wherein said die MTJ pad is further configured to transmit a magnetic signal corresponding to said die electrical signal to said interposer MTJ pad.

10. The semiconductor package of claim 7, wherein said die MTJ pad is further configured to receive a magnetic signal corresponding to said interposer electrical signal from said interposer MTJ pad.

11. The semiconductor package of claim 7, wherein said die MTJ pad is coupled to a sensing circuit in said active die.

12. The semiconductor package of claim 7, wherein said interposer MTJ pad is coupled to a sensing circuit in said interposer.

13. A method for use in a semiconductor package for communicating an electrical signal between an active die and an interposer situated in said semiconductor package, said method comprising:
   transmitting through a die transmit pad a magnetic signal corresponding to a die electrical signal produced by said active die;
   receiving by an interposer magnetic tunnel junction (MTJ) pad said magnetic signal in said interposer;
   producing by a sensing circuit coupled to said interposer MTJ pad a receive electrical signal corresponding to said magnetic signal.

14. The method of claim 13, wherein said die transmit pad and said interposer MTJ pad are spaced apart by a gap.

15. The method of claim 13, wherein said producing said receive electrical signal by said sensing circuit comprises sensing a resistance of said interposer MTJ pad.

16. The method of claim 13, wherein said producing said receive electrical signal by said sensing circuit comprises generating said receive electrical signal according to a resistance of said interposer MTJ pad.

17. The method of claim 13, wherein said die transmit pad and said interposer MTJ pad are configured for unidirectional signaling from said active die to said interposer.

18. The method of claim 13, further comprising:
transmitting through an interposer transmit pad an interposer magnetic signal corresponding to an interposer electrical signal;
receiving by a die MTJ pad said interposer magnetic signal in said active die.

19. The method of claim 18, further comprising producing by a sensing circuit coupled to said die MTJ pad said interposer electrical signal corresponding to said interposer magnetic signal.

20. The method of claim 18, wherein said interposer transmit pad and said die MTJ pad are configured for unidirectional signaling from said interposer to said active die.

* * * * *